United States Patent
Bock et al.

(10) Patent No.: US 8,946,126 B2
(45) Date of Patent: Feb. 3, 2015

(54) PRECURSOR MATERIAL FOR BI-BASED OXIDE SUPERCONDUCTOR AND PROCESS FOR PREPARING SUCH MATERIAL

(75) Inventors: Joachim Bock, Erfstadt (DE); Jurgen Ehrenberg, Hurth (DE); Mark Rikel, Hurth (DE)

(73) Assignee: Nexans, Paris (FR)

( * ) Notice: Subject to any disclaimer, the term of this patent is extended or adjusted under 35 U.S.C. 154(b) by 1716 days.

(21) Appl. No.: 11/284,096

(22) Filed: Nov. 21, 2005

(65) Prior Publication Data

US 2006/0154828 A1 Jul. 13, 2006

(30) Foreign Application Priority Data

Nov. 22, 2004 (EP) .................................. 04300807

(51) Int. Cl.
*H01L 39/24* (2006.01)
*C04B 35/45* (2006.01)
(Continued)

(52) U.S. Cl.
CPC ......... *C04B 35/4521* (2013.01); *C04B 35/6262* (2013.01); *C04B 35/62655* (2013.01); *C04B 35/64* (2013.01); *C04B 35/653* (2013.01); *H01L 39/2477* (2013.01); *C04B 2235/3205* (2013.01); *C04B 2235/3208* (2013.01); *C04B 2235/3213* (2013.01); *C04B 2235/3281* (2013.01); *C04B 2235/3282* (2013.01); *C04B 2235/3298* (2013.01); *C04B 2235/449* (2013.01); *C04B 2235/663* (2013.01); *C04B 2235/761* (2013.01); *C04B 2235/80* (2013.01); *C04B 2235/94* (2013.01); *H01L 39/248* (2013.01)
USPC ........... 505/510; 505/121; 505/300; 505/430; 505/500; 252/519.13; 29/599

(58) Field of Classification Search
CPC .... H01L 39/24; C04B 35/64; C04B 35/4521; C04B 35/4525; C04B 35/65
USPC ......... 505/501, 450, 492, 742, 739, 452, 430, 505/733, 782, 785, 100, 120, 121, 150, 491, 505/500, 729; 264/164; 252/519.13; 29/599; 174/125.1
See application file for complete search history.

(56) References Cited

U.S. PATENT DOCUMENTS 5,242,896 A * 9/1993 Matsubara et al. ............ 505/501
5,324,712 A * 6/1994 Su .................................. 505/492
(Continued)

FOREIGN PATENT DOCUMENTS

JP 09157097 * 6/1997 ............... C03B 29/62

OTHER PUBLICATIONS

Heeb et al, "From Imperfect to perfect Bi2Sr2CaCu2Ox (Bi-2212) grains," J. Mater. Res 1993, V8, No. 9, pp. 2170-2176.*
(Continued)

*Primary Examiner* — Stanley Silverman
*Assistant Examiner* — Kallambella Vijayakumar
(74) *Attorney, Agent, or Firm* — Sofer & Haroun, LLP

(57) ABSTRACT

A precursor material for the preparation of superconductors based on $Bi_2Sr_2Ca_1Cu_2O_{8+\delta}$ wherein the precursor material which is as close to equilibrium state as possible, i.e., has less than 5% in average 2201 intergrowths in the 2212 phase; in particular, the present invention relates to a precursor material, which is converted to the final conductor by partial melt processing, as well as to a process for the production of the precursor material and the use of the precursor material for preparing superconductors based on $Bi_2Sr_2Ca_1Cu_2O_{8+\delta}$.

7 Claims, 3 Drawing Sheets

X-Ray Pattern in accordance with Example 1

(51) Int. Cl.

| | |
|---|---|
| C04B 35/453 | (2006.01) |
| C01G 3/00 | (2006.01) |
| H01B 12/00 | (2006.01) |
| C04B 35/626 | (2006.01) |
| C04B 35/64 | (2006.01) |
| C04B 35/653 | (2006.01) |

(56) References Cited

U.S. PATENT DOCUMENTS

| | | | | |
|---|---|---|---|---|
| 5,541,154 | A * | 7/1996 | Neubacher et al. | 505/450 |
| 5,635,456 | A * | 6/1997 | Riley et al. | 505/501 |
| 5,958,842 | A * | 9/1999 | Holesinger | 505/450 |
| 6,677,278 | B1 * | 1/2004 | Woodall et al. | 505/121 |
| 2003/0062659 | A1 * | 4/2003 | Huang et al. | 264/614 |

OTHER PUBLICATIONS

Rikel et al, "Effect of solidification conditions on microstructure of melt processed B-2212/Ag conductors," Physica-C 2002, 372-376, pp. 1838-1842.*

Chuang et al, "Doubling of the bands in overdoped Bi2Sr2CaCu2O8+d probable evidence for c-axis bilayer coupling," Condensed Mater, Superconductors, 2001, 0102386v1, pp. 1-4.*

X-Ray Diffraction, 2010., http://www/cea.com/techniques/analytical_techniques/xrd.php.*

Markinovic et al, "Characterization and phase transitions of (Bi,Pb)2Sr2Ca2Cu3Ox-Ag composite powder obtained by spray pyrolysis," Materials Chemistry and Physics 2005, 94, 233-240.*

Sager et al, "Enhanced residual secondary phase dissolution by atmosphere control in Bi-2212 superconductors," Physica-C, 2004, 405,103-106.*

Wu et al, "Effects of Processing Parameters on Critical Current Density of Ag-CLAD Bi2Sr2CaCu20x TAPES", Applied Superconductivity, vol. 1. No. 1/2. pp. 33-42, 1993.*

European Search Report—May 20, 2005.

XP009047394—J. Mater. Res., vol. 8, No. 9, Sep. 1993.

XP004507651—Physica C 405 (2004) 103-116—Enhanced residual secondary phase dissolution by atmosphere control in Bi-2212 superconductors—Accepted: Jan. 26, 2004.

XP004375793—Physica C 372-376 (2002) 1839-1842—Effect of solidification conditions on microstructure of melt processes Bi2212/Ag conductors.

XP002328912—Solid State Communications, vol. 72, No. 5, pp. 453-458, 1989—Preparation of single phase 2212 Bismuth Strontium Calcium Cuprate by melt processing.

XP002328663—Applied Superconductivity vol. 1, No. 1/2. pp. 33-43, 1993—Effects of processing parameters on critical current density of Ag-CLAD Bi2Sr2CAcCu2Ox Tapes.

XP000240428—26(1991) December No. 12, Elmsford, NY, US. pp. 1269-1276.

* cited by examiner

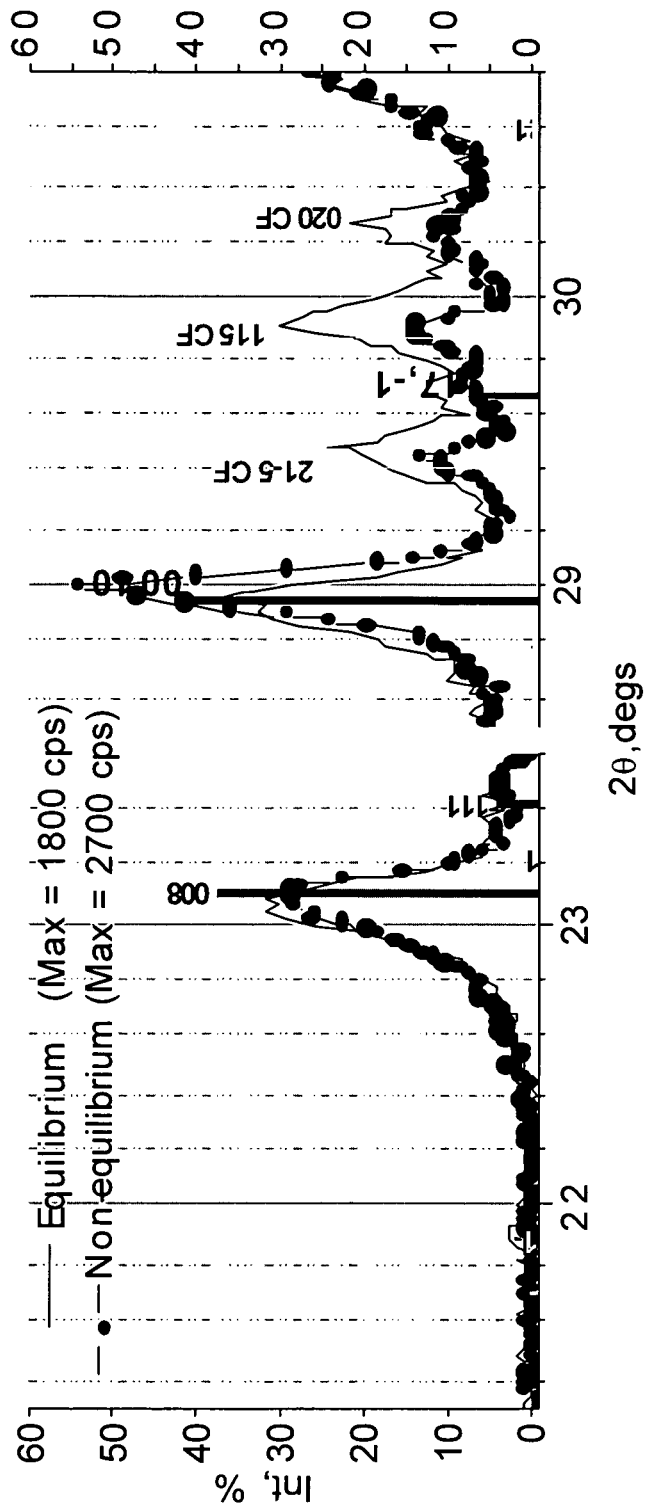
Fig. 1: X-Ray Pattern in accordance with Example 1

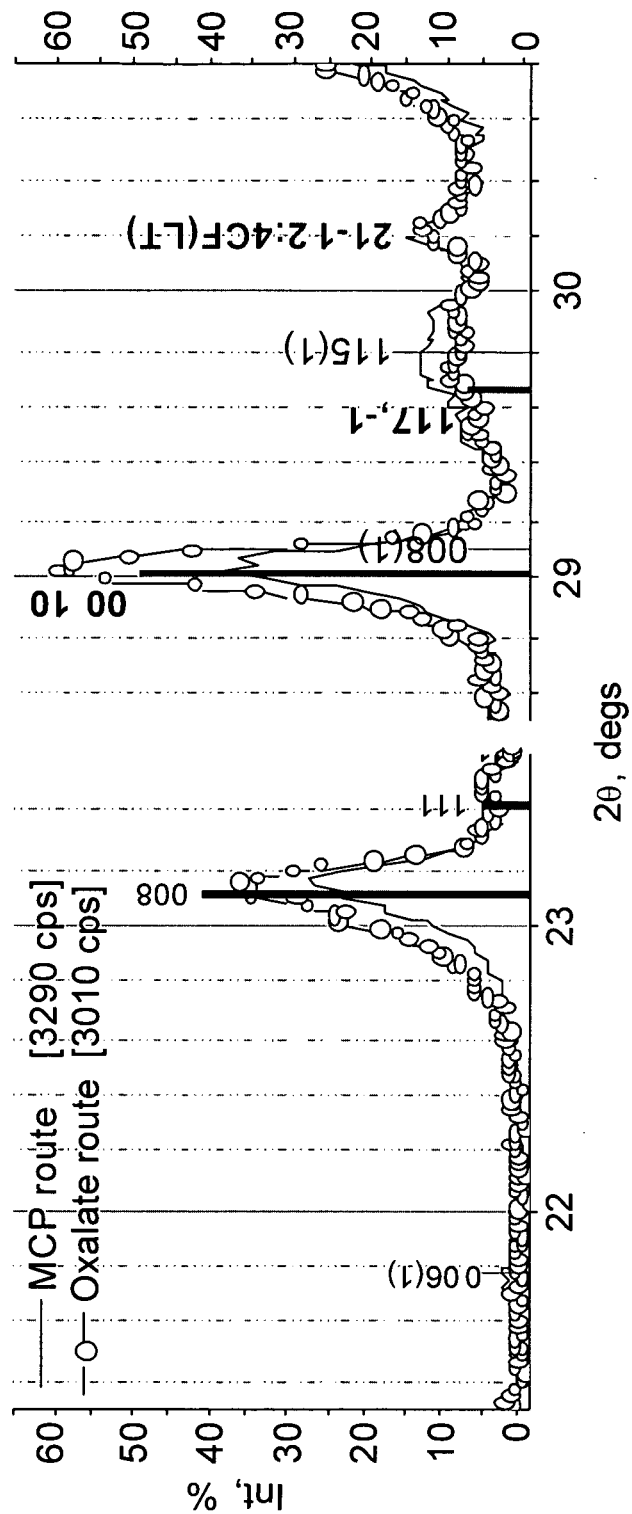
Fig. 2: X-Ray Pattern in accordance of Example 2

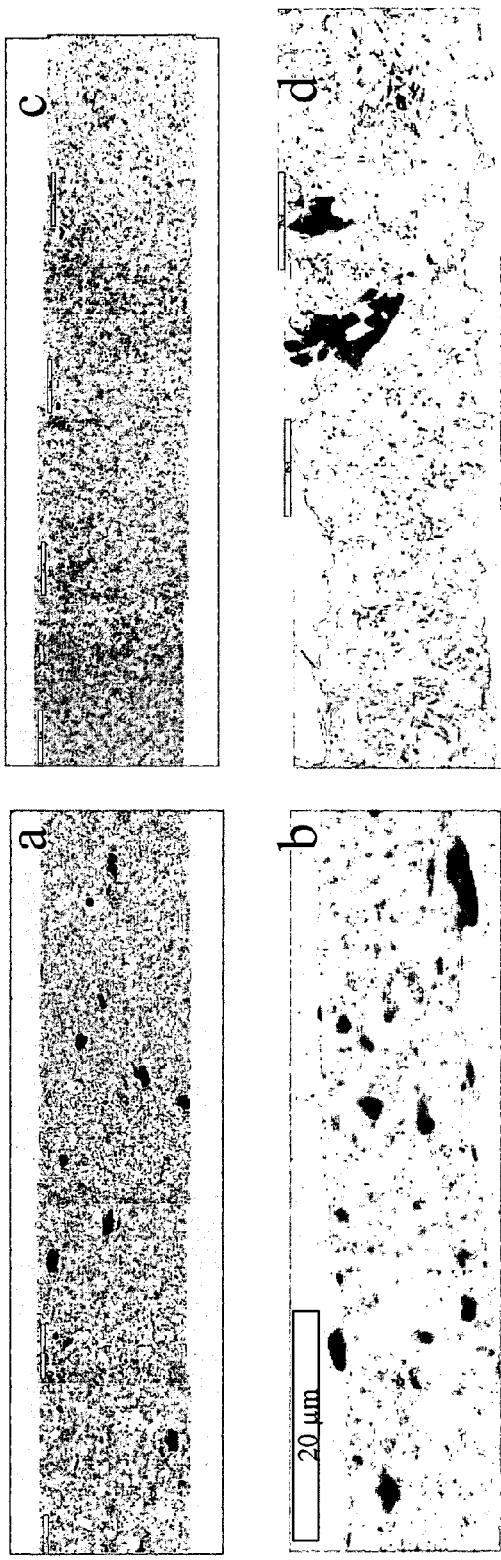
Fig. 3 a)-d): Scanning electron microscope photos of example 3.

PRECURSOR MATERIAL FOR BI-BASED OXIDE SUPERCONDUCTOR AND PROCESS FOR PREPARING SUCH MATERIAL

RELATED APPLICATION

This application is related to and claims the benefit of priority from European Patent Application No. 04 300 807.7, filed on Nov. 22, 2004, the entirety of which is incorporated herein by reference.

FIELD OF THE INVENTION

The present invention relates to a precursor material for the preparation of a Bi-based oxide superconductor, a process for preparing such precursor material and use of the precursor material for the preparation of the superconductor.

BACKGROUND

The first-generation commercial high-temperature superconductors utilize two members of homologous series $Bi_2Sr_2Ca_nCu_{(n+1)}O_{6+2n+x}$ with n=3, abbreviated 2223, and n=2, abbreviated 2212. Herein x stands for the appropriate oxygen content at which the respective compound exhibits superconductivity.

Besides the desired superconducting phases 2223 and 2212 other phases can be found within the superconductor material such as 2201, copper oxides, oxides of alkaline earth metals etcetera. Further, within the grains of 2223 and 2212, intergrowths of other members of homologous series can be found, e.g. short sequences of 2201 and 2223 atomic layers in the 2212 grains.

However, for good superconductor performance in the final superconductor the content of such second phases and intergrowths should be as small as possible and, further, well connected and aligned grains of the superconductor material are required.

In particular 2212 superconductors are widely used since the 2212 phase is more stable than the 2213 phase and can be, in general, obtained by a simpler processing technique. Further, 2212 superconductors can be fabricated in more diverse shapes such as tapes and wires with a great variation of cross sections, for instance of round, square or rectangular geometry, in form of Ag-sheathed monocore and multifilamentary tapes and wires, thick films on various substrates, bulk plates etcetera.

It has been shown, that the final microstructure and superconductor performance strongly depend on the properties of the precursor material used for preparing the superconductor.

In general, as the precursor material a powder mixture of appropriate compounds of the constituent elements with the atomic ratio of the desired superconductor material is used, that is in case of Bi2212 of Bi:Sr:Ca:Cu of 2:2:1:2. Techniques for preparing the powder mixtures are generally known, e.g. by chemical mixing the constituent elements in solutions in form of nitrates and their subsequent decomposition via, e.g. aerosol spray pyrolysis, oxalate coprecipitation followed by spray-drying, freeze-drying etcetera.

It is known that the properties of the superconductor material can be improved if a precursor powder is used having high homogeneity of composition and small particle size.

For fabricating the superconductors the so called oxide-powder-in-tube (OPIT) technique can be advantageously used. In this technique, the precursor powder is inserted into a tube of normal conducting material, commonly Ag or an Ag-alloy are used, so called billets. The filled billets are deformed, e.g. by drawing, to produce monofilamentary wires.

These monofilamentary wires are usually assembled in new billets of Ag or Ag-alloy, that are deformed, e.g. by drawing and/or rolling, into multifilamentary wires and tapes, respectively. This process can be repeated several times leading to superconductor geometries of different complexity. A typical final filament diameter in the resulting multifilamentary wires is 10 to 20 µm.

The resulting Bi2212/Ag superconductors are then subjected to a heat treatment, the so called partial melt processing (PMP). The PMP of Bi2212 superconductors aims to obtain well connected, phase-pure and well aligned Bi2212 material. During PMP the superconductor is heated above the decomposition temperature of the 2212 phase in order to eliminate porosity and random grain orientation and then is slowly cooled down to crystallize new 2212 grains. This inverse peritectic reaction of 2212 formation is difficult to complete because of problems resulting from consuming second phases grown during the melting step. Optimal processing is usually considered to be a compromise between good connectivity which requires longer time in the melt state and phase purity which requires dissolution of the second phases which grow while in the partial melt state.

Commonly used precursor material has high homogeneity in composition and usually a particle size of 1 to 5 µm. Further, the Bi2212 grains of the commonly used precursor material show 10 to 20% intergrowths of 2201.

There was a need for further optimisation of the partial melt processing. In particular, there was a need for obtaining a final superconductor material having good connectivity between the grains on the one hand, but, on the other hand, without or with a minimum formation only of second phases during the melt processing.

OBJECTS AND SUMMARY

According to the present invention the problems discussed above are solved by the use of a precursor material based on Bi2Sr2Ca1Cu2O8+x for preparing oxide superconductors based on Bi2Sr2Ca1Cu2O8+x, wherein the Bi2Sr2Ca1Cu2O8+x phase of the precursor material comprises less than 5% in average intergrowths of Bi2Sr2Cu1O6+x (Bi2201) within the 2212 phase. Within the meaning of the present invention such material is referred to as "equilibrium material".

Preparation of 2212 material with low density of 2201 intergrowths has been described in the literature.

In Heeb et al. "From imperfect to perfect $Bi_2Sr_2CaCu_2O_x$ (Bi-2212) grains" in J. Mater. Res., Vol. 8, No. 9, September 1993, pages 2170 to 2176, which is incorporated herein by reference, the production of 2212 superconductors is disclosed having reduced 2201 intergrowths wherein the dependency of 2201 intergrowths with annealing time is particularly considered. According to Heeb 2201 intergrowths in the final superconductor can be drastically reduced with an annealing time of about 100 hours.

Rikel et al. in "Effect of solidification conditions on microstructure of melt processed Bi2212/Ag conductors" in Physica C 372-376 (2002) 1839-1842, is direct to the preparation of final 2212 material via partial melt processing. Here the sample with the precursors is heated above the peritectic melt temperature, then cooled down to a solidification temperature below the peritectic melt temperature and kept at this solidification temperature for annealing. It is observed that the density of 2201 intergrowths in the 2212 phase decreases with decreasing cooling rate. Here a 2212 superconductor material is disclosed with only 0.6±0.3% 2201 intergrowths. However, as is described in Rikel et al., this is achieved due to slow formation of 2212 phase in equilibrium with liquid and in expense of formation of 2201 as a separate phase, so that the final material is not at equilibrium.

Note that the microstructure equilibration (particularly decreasing the density of 2201 intergrowths in 2212 phase) was considered as an issue in application to the final product only. In the above examples, these were zone-melt processed bulk 2212 in Heeb et al and partially melt processed Ag-sheathed 2212 conductors in Rikel et al. In preparation of powder materials, which are used as precursor materials for OPIT conductors, the issue of material equilibration was usually not considered at all.

For example, Bloom et al. in "Solid state synthesis of $Bi_2Sr_2CaCu_2O0$ superconductor" in Mat. Res. Bull., Vol. 26, pp. 1269-1276, 1991, which is incorporated herein by reference, gives a study of the reaction sequence on formation of 2212 superconductors by reaction of oxides and carbonates via initial formation of Bi-compounds, subsequent reaction to form the 2201 phase and Ca—Cu oxides and transformation of 2201 phase to 2212 phase. Based on their X-ray diffraction data, they report on formation of single-phase 2212 for composition, which is subsequently shown to lie outside the single-phase region (D6=Majewski 1997). The reason for that is incomplete equilibration of their powder. Using correlation between the intensities of 008 and 0010 lines and the average density $<f>$ of 2201 intergrowths in 2212 phase, which is discussed below (page X), we may conclude from XRD pattern presented in Bloom et al (page 1273) that their powder consisted of 2212 phase with 5.9±1.1% 2201 intergrowths (the parameter $x_{8,10}$=0.72±0.04).

In publications referred to specific precursor materials, the degree of equilibration was also not taken into account. For example, in U.S. Pat. No. 5,541,154 of Neubacher et al. a process for preparing a precursor material for the OPIT-technique for preparing 2223 and 2212 high superconductor is disclosed. According to this process the starting powder is heated at a temperature of between 600 and 900° C. in order to obtain the desired high temperature superconductors. Note that the 2223 precursor material used for OPIT conductors is in principle very far from equilibrium (because of the metastability of the partial melt process used for preparation of OPIT 2223 conductors). The degree of equilibration of 2212 powder was never considered as an important parameter, most likely because the OPIT conductors prepared using such precursors are subjected to partial melt processing when this initial state was thought to be "forgotten" (see D5=Sager et al. 2005).

In the present invention, we show that the microstructure of the final product "remembers" the initial state and pay special attention to the degree of equilibration of precursor materials used for preparation of 2212 OPIT conductors. We claim that it is advantageous to use equilibrium precursor material and specify the closeness to the equilibrium state. We consider as "equilibrium", the precursor materials in which the Bi2Sr2Ca1Cu2O8+x phase comprises less than 5% in average intergrowths of Bi2Sr2Cu1O6+x (Bi2201).

According to a further aspect, the present invention is directed to a precursor material of a nominal composition according to the chemical formula Bi2+xSr2−yCa1−zCu2O8+δ, wherein −0.1≤x≤0.4; −0.1≤y≤1.6; −0.4≤z≤0.2 and x+y+z=0, which has less than 5% in average intergrowths of 2201 within the 2212 phase.

The precursor material of the present invention includes single phase materials as well as multiphase materials, preferably in case of multiphase materials the content of second phases is 15% or less, more preferably 10% or less.

Furthermore, the present invention relates to a process for preparing the precursor material as used in the present invention.

In particular, the present invention is also directed to the use of a precursor material with less than 5% in average intergrowths of 2201 in the 2212 phase for the production of a 2212 high temperature superconductor, in particular, for the production by a melt cast technique, more preferably by partial melt cast technique.

BRIEF DESCRIPTION OF THE DRAWINGS

That is, according to the present invention the above cited problems involved with the prior art are solved by using a precursor material being as close as possible at its equilibrium state.

It is shown in

FIG. 1 the x-ray diffraction (XRD) patterns of a precursor material of the present invention and of a non-equilibrium precursor material, both having the same nominal composition;

in FIG. 2 another example of XRD patterns of a precursor material of the present invention and of a less equilibrium precursor material both having the same nominal composition; and in FIG. 3 SEM (Scanning electron microscope) images of tapes made from the precursor materials in accordance to FIG. 1.

DETAILED DESCRIPTION

Generally, a material of a given chemical composition is said to be at "thermodynamic equilibrium" under given external conditions of pressure and temperature when its free energy is minimum. Physically this means a state that once reached never changes when the material is stored under given pressure and temperature.

Since a material being really in equilibrium is almost impossible to produce and, further, determination of the state of equilibrium requires an infinite-time experiment, which is also clearly not possible, within the meaning of the present invention the term "precursor material in its equilibrium state" means a precursor material that is as close to equilibrium as possible. For determining the state of equilibrium of precursor material, in the present invention such a characteristic as the density of Bi2201 intergrowths in the Bi2212 phase is used. That is, according to the present invention a "precursor material in its equilibrium state", also referred to "equilibrium precursor material", is a material that is close to equilibrium in terms of its phase composition. The precursor material of the present invention is, thus, characterized in that the Bi2212 phase in it comprises less than 5%, preferably less than 3% and more preferably less than 1%, Bi2201 intergrowths in average.

The present inventors observed, that when a superconductor body made of a homogeneous precursor material is subjected to partial melt processing, the precursor material comprising a high content of 2201 intergrowths such as of more than 5%, renders inhomogeneous well before partial melting. That is, even when a homogeneous precursor material is used for preparing the superconductor body the material is inhomogeneous when reaching its melting region. Due to this inhomogeneity the melting event is broadened, that is, melting occurs over a temperature range broader than in case of homogeneous material. As a result of this broad melting range large phase separation occurs during melting and, as a consequence, the performance of the final superconductor is deteriorated.

It is believed by the present inventors that the reason for the formation of inhomogeneity in a precursor material comprising more than 5% 2201 intergrowths is that such a material is not at equilibrium. Upon heating a superconductor made of such non-equilibrium material, the material undergoes reactions in order to reach equilibrium. However, the approach to equilibrium or degree of equilibrium reached can be different in different parts of the superconductor. Due to this different approach to equilibrium in different parts of the superconductor the material is rendered inhomogeneous during the heating.

This effect is particularly critical in case of superconductor filaments. Due to the small filament diameter of usually less than 20 μm there are geometrical constraints, which enhance the difference in approaching the equilibrium state over the superconductor filament length.

In the present precursor material, the Bi2212 phase comprises less than 5% in average intergrowths of Bi2201, that is the material is already close to equilibrium. When a superconductor made of such an equilibrium precursor material is heated, there is no driving force for any chemical reaction and as a result the material remains homogeneous during heating up and partial melting. Consequently, the melting range is narrow and phase separation during heating is avoided or at least minimized.

The precursor material of the present invention can have the form of a powder or bulk material.

In case of a powdery material the particle size can be selected according to need. Usually, the same particle size can be applied as in the prior art, for instance a particle size distribution with $d_{50}$ about 1 to 5 μm.

For the precursor material of the present invention parts of Bi can be substituted by Pb.

On demand further elements may be present in the precursor material. For example, the precursor material of the present invention may contain $SrSO_4$ and/or $BaSO_4$ as auxiliaries in an amount up to 20% by weight or when $BaSO_4$ is used, preferably only up to about 10% by weight, based on the mixture of the components with the constituent elements Bi, optionally Pb, Sr, Ca, Cu, for instance a mixture of oxides of these constituent elements.

Such compounds are disclosed for example in EP-A-0 524 442 and EP-A-0 573 798 to which reference is explicitly made.

The present invention is further directed to a precursor material with a nominal composition represented by formula I:

$$Bi2+xSr2-yCa1-zCu2O8+\delta$$

wherein $-0.1 \leq x \leq 0.4$; $-0.1 \leq y \leq 1.6$; $-0.4 \leq z \leq 0.2$ and $x+y+z=0$. This includes also compositions which are arithmetically equivalent to this formula and that are close to equilibrium, that is wherein the 2212 phase in the material contains less than 5% in average of 2201 intergrowths.

The density of 2201 intergrowths in 2212 phase and, thus, the degree of equilibrium, can be determined using x-ray diffraction patterns (XRD).

Presence of intergrowths of density f results in shifts of centroid positions and broadening of 00/reflections in the XRD patterns. To the first approximation, these are given by the formulas (in radians):

$$\Delta <2\theta> = -2f(1-f) > \frac{\sin(\pi l c_1/c_2)}{\pi l}\tan(\theta), \quad (1)$$

$$FWHM = 2<f> \frac{[1-\cos(\pi l c_1/c_2)]}{\pi l}\tan(\theta). \quad (2)$$

where $c_1$ and $c_2$ are the lattice parameters of Bi2201 and Bi2212, respectively; $\theta$ is the diffraction angle, $l$ is the Miller index of reflection and FWHM means Full Width at Half Maximum; brackets $< \ldots >$ mean averaging.

However, calculating the density of intergrowths using (1) and (2) is rather tedious. As a faster way for assessing $<f>$, the present inventors developed a simpler procedure that uses the intensities $I$ and the areas A under the 008 and 00.10 reflections of 2212 phase in the XRD patterns. Based on their experience of calculating density of intergrowths from the line shifts, they found a correlation between $<f>$ and the quantity $$x_{8.10} = \frac{I_{008}}{I_{00.10}} \frac{A_{00.10}}{A_{008}}.$$

Since the area to intensity ratio defines the integral breadth $\beta = A/I$, the introduced quantity is the ratio of integral breadths $$x_{8.10} = \frac{\beta_{00.10}}{\beta_{008}}$$

of 00.10 and 008 reflections. For diffraction conditions of the used diffractometer-Cu Kα radiation, the full width at half maximum of $K\alpha_1$ line of $LaB_6$ NIST (National Institute of Standards of USA) reference sample is 0.11±0.01°(2θ) for 18<2θ<90°– the correlation reads

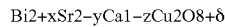

The equilibrium precursor material of the present invention which contains less than 5% 2201 intergrowths in the 2212 grains has an XRD patterns satisfying the condition $$\frac{I_{008}}{I_{00.10}} \frac{A_{00.10}}{A_{008}} > 0.77,$$

wherein $I_{008}$ and $I_{00.10}$ are maximum intensities and $A_{008}$ and $A_{0010}$ are areas under the 008 and 00.10 lines.

For the preferred equilibrium precursor material with 2201 intergrowths of less than 1% this condition is $$\frac{I_{008}}{I_{00.10}} \frac{A_{00.10}}{A_{008}} > 1.12.$$

As starting material for the preparation of the equilibrium precursor material of the present invention any known starting material can be used applied for the preparation of 2212 superconductors. For example the starting material can be produced by melt casting, melt quenching, aerosol pyrolysis or spray drying of oxalates, melt casting being preferred.

As starting material a Bi2212 powder can be used wherein the oxides of the constituent elements are admixed in an appropriate atomic ratio for obtaining the desired Bi2212 superconductor. It is well known that the atomic ratio of 2:2:1:2 is an ideal stoichiometry, and it is to be understood that this ratio can vary, for instance, for a precursor material of formula I or of a composition being arithmetically equivalent to the precursor material in accordance to formula I.

The equilibrium precursor material of the present invention can be obtained by annealing the resulting powdery mixture or shaped article at a temperature as close as possible at the peritectic melting temperature ($T_p$) of said material but without melting the material.

Preferably the equilibrium precursor material of the present invention can be obtained by annealing the resulting powdery mixture or shaped article at a temperatures of 20 to 5° C. below the peritectic melting temperature ($T_p$) of said material, for example above 850° C. in air. That is, when the precursor material is heated up for annealing no melting step is included.

By annealing in this temperature range without melting a precursor material can be obtained wherein the 2212 phase contains less than 5% in average 2201 intergrowths.

At a temperature of more than 20° C., in particular at 40° C. or more, below Tp precursor materials are obtained wherein the density of 2201 intergrowths in 2212 phase exceeds 5%.

Approaching equilibrium is facilitated when bulk materials are used. Therefore, equilibration annealing heat treatments are preferably done using agglomerated materials, preferably, pressed rods or bulk lumps (in case of melt-cast material). Annealing at temperatures close to melting is usually avoided because of the material sintering and grain growth resulting in large particle sizes whereas for the production of superconductors small particle sizes are preferred. However according to the present invention, this problem can be solved by controlling and adjusting the particle size using comminution of the annealed material.

When the equilibrium precursor material with less than 5% in average 2201 intergrowth within the 2212 phase is used, 2212 superconductors can be obtained showing 2 to 3 times better performance with respect to critical current at 4.2 K, even in kilometer lengths of superconductor.

The present invention is now further explained by specific examples.

In the examples, an equilibrium precursor material of the present invention is compared with a non-equilibrium precursor material having the same nominal composition.

In these examples, the presented XRD patterns were measured at the X'PRT diffractometer (Philips) using CuKα radiation (secondary monochromator), automatic divergence slit, and 0.4° receiving slit; the conditions that provide the FWHM of K$\alpha_1$ line of LaB$_6$ NIST (National Institute of Standards of USA) reference sample of 0.11±0.01°(2θ) for 18<2θ<90°.

The SEM images (backscattered electron mode) were obtained at JEOL JSM6400F scanning electron microscope.

EXAMPLE 1

Precursor materials are prepared having a nominal composition of Bi2.00Sr2.00Ca1.00Cu2.00Ox.

For both equilibrium and non-equilibrium precursor materials, preparation of the starting material was the same: Bi2O3, SrO, CaO and CuO-powders are taken in an amount appropriate for Bi2.00Sr2.00CaCu2.00Ox stoichiometry and were thoroughly mixed and molten in air in Pt crucibles for 0.5 hours at 1100° C.

The melt was then poured on a Cu base and solidified. The resulting bulk plates were 3 to 7 mm thick and consist of crystalline phases Bi2201, (Sr,Ca)CuO2 alkaline-earth cuprate [1:1AEC] phase, Bi2(Sr,Ca)3O6 Cu-free [2:3CF] phase, and Cu2O with a morphology varying along the plate thickness.

The melt cast plates were first oxidized at 740° C. in artificial air for 10 hours to avoid melting upon heating above 750° C.

Preparation of Non-Equilibrium Precursor Material.

The oxidized material obtained above was crashed, jet-milled, and pressed into rods of 18 mm diameter. The rods were annealed in flowing air at 840° C. for 40 hours.

Preparation of Equilibrium Precursor Material of the Present Invention:

The oxidized plates obtained above were further heated in flowing artificial air up to 865° C. and annealed at this temperature for about 16 hours, then slowly cooled to 835° C. followed by furnace cooling.

The resulting oxidized material was crashed, jet-milled and, pressed into rods of 18 mm diameter. The rods were annealed in flowing artificial air at 865° C. for 16 hours.

The XRD-patterns of both precursor materials are shown in FIG. 1. Based on the intensity ratio of the 008 and 0010 lines of the 2212 phase it can be estimated that the 2212 phase in the non-equilibrium precursor material contains much more 2201 intergrowths, namely 8% versus less than 1% in the equilibrium material of the present invention. This means that the equilibrium precursor material of the present invention is much closer to the equilibrium state.

Further based on the absolute intensities of line 115 it can be estimated that in expense of having almost no intergrowths in the 2212 phase, the equilibrium precursor contains approximately 30% more Cu-free 2:4CF-phase. This looks like disadvantage. It has to be noted however, that the absent part of Cu-free phase will be in any case formed during heating the conductor made using the non-equilibrium precursor close to melting as can be seen in Example 3.

EXAMPLE 2

Precursor materials were prepared having an overall composition of Bi2.19Sr1.90Ca0.98Cu1.93Ox.

The starting material for the non-equilibrium precursor was prepared using the oxalate route.

Solutions of Bi, Sr, Ca and Cu nitrates were mixed in amounts appropriate for $Bi_{2.19}Sr_{1.90}Ca_{0.98}Cu_{1.93}Ox$ stoichiometry. After adding oxalic acid, the solution was spray dried to produce a mixture of Bi, Sr, Ca and Cu oxalates.

The oxalate powder thus obtained was decomposed in flowing gas (13% O$_2$/balance O$_2$) by slow heating to 820° C. and annealing at 820° C. for about 8 hours with subsequent furnace cooling. As a result an extremely non-equilibrium phase mixture of 2212, 2201 and some minor phases was obtained.

From the resulting powder, rods were pressed and annealed at 865° C. for 16 hours.

The annealed rods were crashed and jet-milled. The resulting material was finally annealed at 675° C. for 36 hours in flowing artificial air.

Preparation of equilibrium Precursor Material of Present Invention:

For the preparation of the starting material the melt-cast processing (MCP) route was used.

An oxide mixture with an atomic ratio of the constituent elements appropriate for $Bi_{2.19}Sr_{1.90}Ca_{0.98}Cu_{1.93}Ox$ was melt-cast and treated as described in example 1 with the exception that two more steps of jet-milling and final annealing at 675° C. for 36 hours in flowing artificial air are used to obtain the powdery material.

The XRD patterns of the powdery precursor materials obtained are shown in FIG. 2. The analysis data are summarised in Table 1 below. In Table 1 the content of 2201 as separate phase as well as intergrowths in 2212 grains is given.

TABLE 1

| Sample | Phase composition | | 2212 phase | |
|---|---|---|---|---|
| | 2201 wt % | 2:4 CF vol. %* | $x_{8.10}$** | % 2201 intergrowths |
| Comp. | 4.0(1.0) | 2.5(5) | 0.76(3) | 4.5(5) |
| Invention | 9.5(2.0) | 2.7(4) | 1.15(5) | 0.5(5) |

*based on correlation (not shown) of XRD and SEM data;

**$x_{8.10} = \dfrac{I_{008}}{I_{00.10}} \dfrac{A_{00.10}}{A_{008}}$

The equilibrium precursor contains 2212 phase with less intergrowths than the less equilibrium one, but in expense of having more 2201 as a separate phase. It is worth noting that the sum of 2201 as a separate phase and as intergrowths is almost the same in both precursor materials.

EXAMPLE 3

The powdery precursor materials obtained in Example 1 are used for producing tapes in accordance to OPIT technique using Ag billets.

The SEM images of the tapes are shown in FIG. 3 wherein FIGS. 3a and 3c, respectively represent the green tapes prepared using equilibrium precursor material of the present invention (FIG. 3a) and non-equilibrium precursor material (FIG. 3c). FIGS. 3b and 3d are the SEM images of the tapes after annealing close to the melting temperature at 865° C. for 64 hours in 100% oxygen.

When comparing FIGS. 3a and 3c the green tape of the non-equilibrium material looks much more uniform than the respective one of the equilibrium material of the present invention. However, after annealing only tiny changes in particle size distribution of second phases take place in case of the tape prepared using the equilibrium precursor material of the present invention (FIG. 3b), whereas the tape prepared using a non-equilibrium precursor material is much less uniform due to "uncontrolled" precipitation of second phases. The presence of large particles as shown in FIG. 3d prior to the melting during PMP can be considered as a serious drawback.

From this examples it becomes clear that the equilibrium precursor material of the present invention can be advantageously used for obtaining superconductors prepared in accordance to the OPIT-technique, that is, for melt processing superconductors prepared by the OPIT technique.

The invention claimed is:

1. Bi2212 precursor material for the preparation of Bi2212 based superconductors comprising:
    2212 phase having less than 5% in average 2201 intergrowths wherein the precursor material has a nominal composition of Bi 2+x Sr 2−y Ca 1−z Cu 2O8+δ, wherein −0.1≤x≤0.4; −0.1≤y≤1.6; −0.4≤z≤0.2 and x+y+z=0 and wherein the precursor material is a multiphase material wherein the content of the second phase is 15% or less.

2. Bi2212 precursor material for the preparation of Bi2212 based superconductors comprising:
    2212 phase having less than 5% in average 2201 intergrowths wherein the precursor material is suitable as starting material for the preparation of a Bi2212 based superconductor by partial melt process and has a nominal composition of Bi 2+x Sr 2−y Ca 1−z Cu 2O8+δ, wherein −0.1≤x≤0.4; −0.1≤y≤1.6; −0.4≤z≤0.2 and x+y+z=0.

3. Bi2212 precursor material according to claim 2, wherein the precursor material is a multiphase material wherein the content of the second phase is 15% or less.

4. Bi2212 precursor material according to claim 2, wherein the precursor material is a melt cast material.

5. Bi2212 precursor material according to claim 2, wherein there is less than 3% in average 2201 intergrowths in the 2212 phase.

6. Bi2212 precursor material according to claim 2, wherein there is less than 1% in average 2201 intergrowths in the 2212 phase.

7. Bi2212 precursor material according to claim 2, wherein the precursor material is a multiphase material wherein the content of the second phase is 10% or less.

* * * * *